(12) United States Patent
Bischoff

(10) Patent No.: US 6,466,380 B2
(45) Date of Patent: Oct. 15, 2002

(54) IRIS DIAPHRAGM

(75) Inventor: Thomas Bischoff, Aalen (DE)

(73) Assignee: Carl-Zeiss-Stiftung (DE)

( * ) Notice: Subject to any disclaimer, the term of this patent is extended or adjusted under 35 U.S.C. 154(b) by 22 days.

(21) Appl. No.: 09/825,665

(22) Filed: Apr. 3, 2001

(65) Prior Publication Data

US 2001/0028998 A1 Oct. 11, 2001

(30) Foreign Application Priority Data

Apr. 5, 2000 (DE) .......................................... 100 16 925

(51) Int. Cl.$^7$ .............................. G02B 9/00; G02B 9/08
(52) U.S. Cl. ..................... 359/739; 396/495; 396/510
(58) Field of Search .......................... 359/738, 739, 359/740, 227; 353/97; 396/355, 449, 450, 461, 495, 510

(56) References Cited

U.S. PATENT DOCUMENTS

| 2,949,076 A | 8/1960 | Finkl |
| 4,199,247 A | 4/1980 | Schwarz |
| 4,367,931 A | 1/1983 | Kawai et al. |
| 4,695,145 A | 9/1987 | Kawamoto |
| 5,072,249 A | * 12/1991 | Yoshida ....................... 396/510 |
| 5,140,212 A | 8/1992 | Iwasaki et al. |
| 5,926,663 A | * 7/1999 | Suzuki ........................ 396/449 |

* cited by examiner

*Primary Examiner*—Mark A. Robinson
(74) *Attorney, Agent, or Firm*—Wells St. John P.S.

(57) ABSTRACT

An iris diaphragm, in particular for an exposure lens in semiconductor lithography, is provided with a diaphragm base (2) and a grooved ring (1) which can be rotated relative to one another, having a multiplicity of leaves (4) which in each case are mounted in the diaphragm base (2) and in the grooved ring (1) and are guided by curved tracks (6), arranged in the grooved ring (1), for the purpose of adjusting the diaphragm aperture. A drive device (11) serves the purpose of twisting the diaphragm base (2) and grooved ring (1) relative to one another. The curved tracks are designed as circumferential tracks (6) in the grooved ring (1). The circumferential track (6) is split up into alternating useful-region curves (6a) and return curves (6b). The diaphragm base (2) or the grooved ring (1) can be rotated in a preselected rotary drive direction by a drive device (11), the leaves (4) being guided in a circulating fashion in the circumferential track (6).

10 Claims, 3 Drawing Sheets

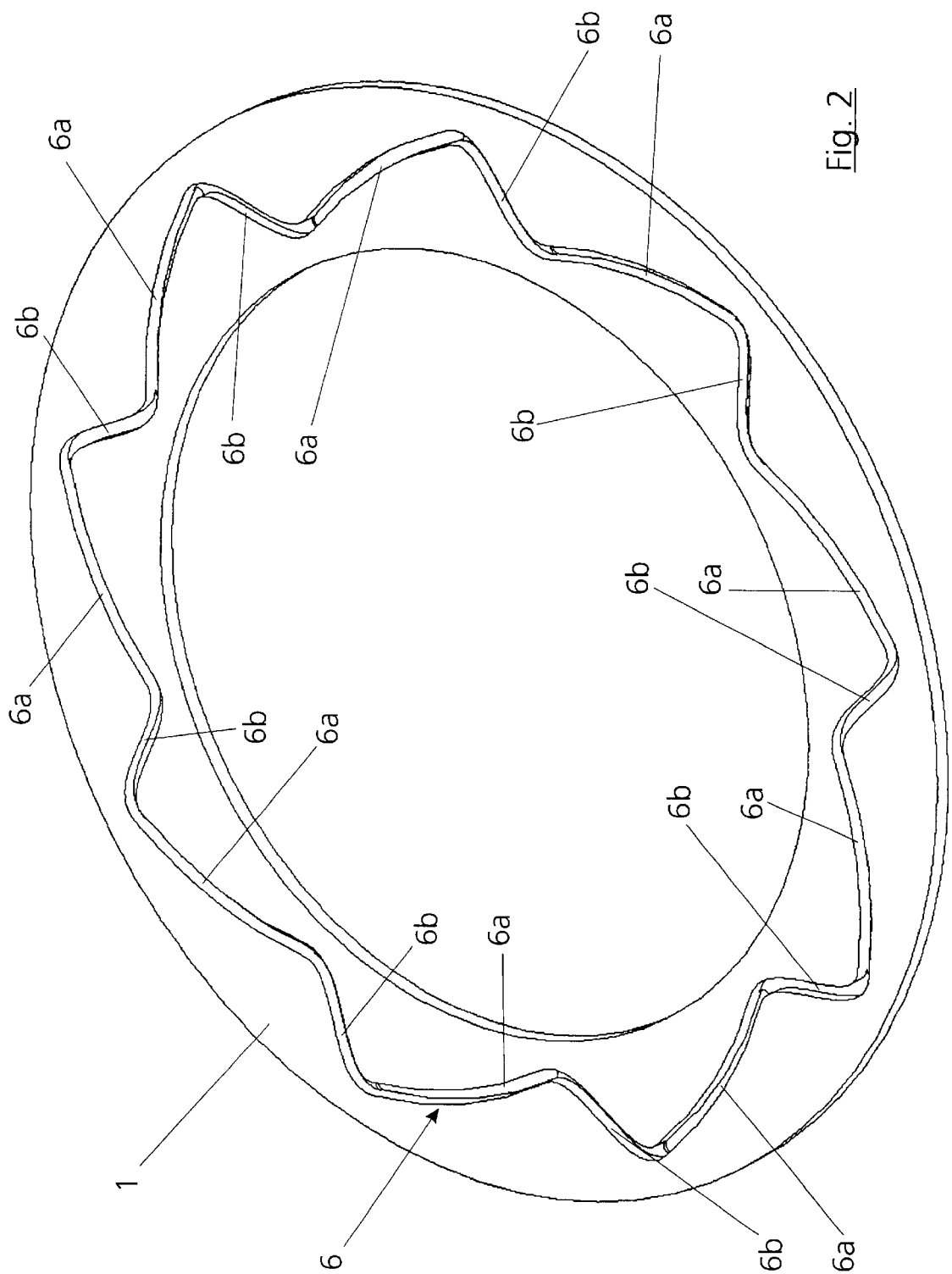

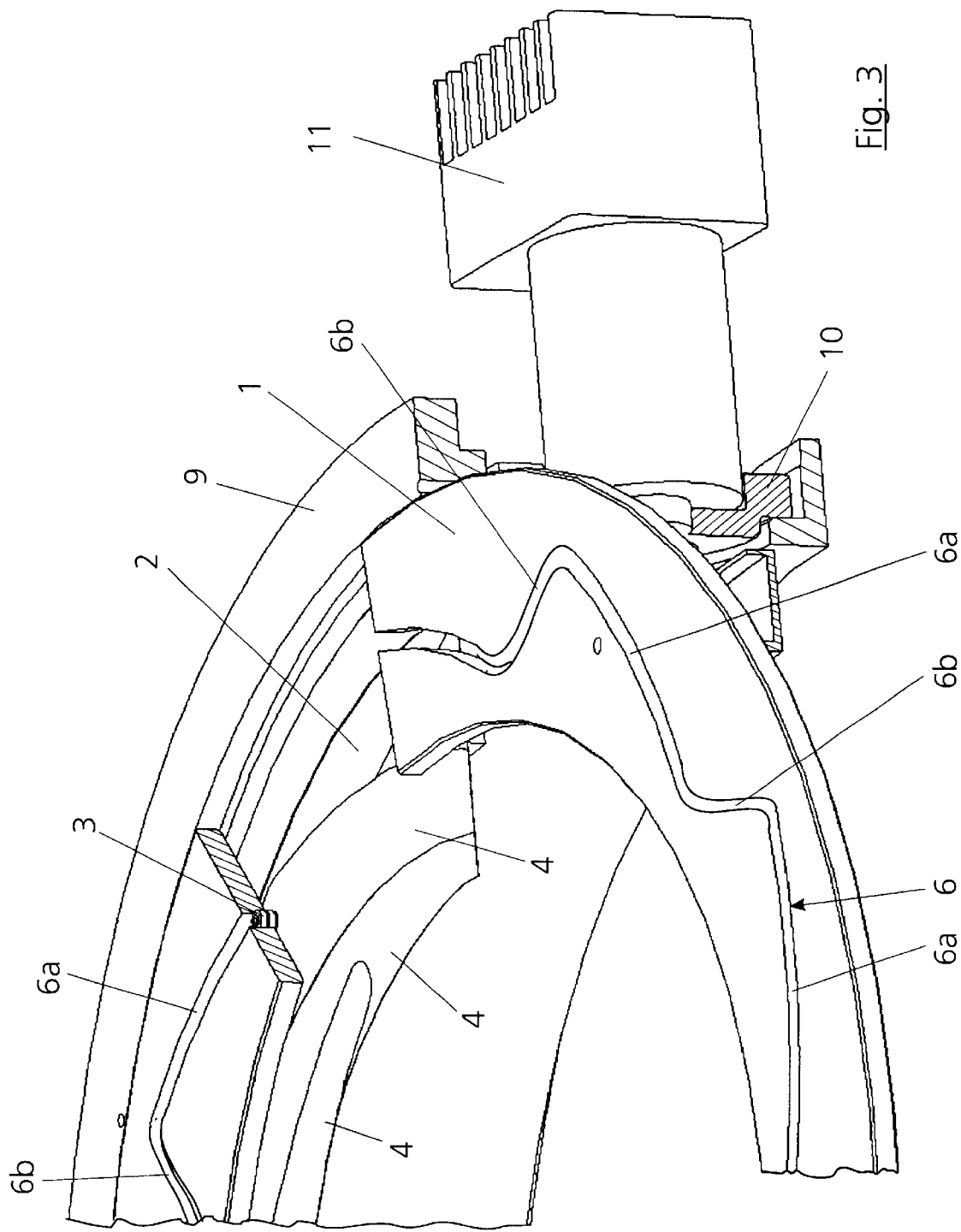

IRIS DIAPHRAGM

CROSS REFERENCE TO RELATED APPLICATION

This application relates to and claims priority to corresponding German Patent Application No. 100 16 925.2, which was filed on Apr. 5, 2000, and which is incorporated by reference herein.

FIELD OF INVENTION

The invention relates to an iris diaphragm, in particular for an exposure lens in semiconductor lithography.

BACKGROUND

In previous iris diaphragms, including the case of iris diaphragms for exposure lenses in semiconductor lithography, changes in diameter of the diaphragm aperture are achieved by an oscillating movement. The change in diameter is carried out in this case by a multiplicity of leaves which are each mounted with one end in a so-called diaphragm base and with their other end respectively in a grooved ring. The leaves are curved like sickles, and an oscillating drive device guides the leaves, depending on the direction of rotation, more or less deeply in the fashion of a chord into the diaphragm aperture, the light beam passing through being cut as a result.

Together with the loads it produces, the oscillating movement—in which not inconsiderable masses are to be moved—has a disadvanatageous effect on the service life of the iris diaphragm. This holds, in particular, when high cycles obtain as is the case, for example, with an exposure lens in semiconductor lithography.

It is therefore the object of the present invention to create an iris diaphragm of the type mentioned at the beginning which has a long service life, in particular which operates precisely and with low wear even for high opening and closing cycles of the leaves.

This object is achieved according to the invention by the features named in the characterizing part of claim 1.

Instead of an oscillating movement, a linear or continuous rotary movement is achieved with the aid of an inherently closed circumferential track by the inventive configuration of the grooved ring with the useful-region curves and the return curves in the selected configuration. By comparison with an oscillating movement, a continuous rotary movement exerts substantially less load on the parts participating in the movement.

In one configuration according to the invention, it can be provided that the return regions are designed at least approximately as multinomials. By using a multinomial, it is possible to create a high degree of freedom from forces during the rotary movement, very fast switching movements thus also being possible for the purpose of adjusting the leaves. A smooth transition, and thus a smooth force profile without jumps, are achieved by the multinomial according to the invention.

In a further configuration of the invention, it can be provided that the leaves are each provided with a bearing via which they are respectively guided in the circumferential track, a high degree of freedom from friction being achieved upon use of the bearings as antifriction bearings, something which was not directly possible in the solution according to the prior art.

In a very advantageous configuration, it can be provided in this case that each leaf respectively has two antifriction bearings in the manner of a parallel guide.

Since the leaf sheets are generally relatively thin and therefore correspondingly at risk in the case of fatigue loading, the bearing according to the invention can deliver a higher level of dependability and thus a longer service life.

A very advantageous development of the invention can consist in selecting the rotary drive direction of the drive device and the courses of the useful-region curves and of the return curves such that upon opening of the diaphragm aperture in the track regions of the return curves a tractive force is exerted on the leaves.

This directional force according to the invention is opposite to the direction of movement of the prior art, a tractive force being exerted on the leaves when the diaphragm closes. Specifically, so-called parallel curves are obtained in this way during the oscillating movements, as a result of which it is easier to master the forces acting on the leaves and the rivets via which the leaves are connected to the grooved ring and the diaphragms.

Although the solution according to the invention in the useful-region curves does now entail a somewhat poorer force profile, because of the possibility of more effectively bearing the leaves, for example with the aid of antifriction bearings, and the continuous rotary movement, this is possible without difficulties. On the other hand, a better force profile is achieved by this course of movement in the return curves.

For assembly reasons, it can be advantageous for the useful-region curves or the return curves to be designed as continuous slots in the grooved ring.

An exemplary embodiment of the invention is described in principle below with the aid of the drawing, in which:

BRIEF DESCRIPTION OF THE DRAWINGS

FIG. 2 shows a perspective illustration of a grooved ring; and

FIG. 3 shows a view of the iris diaphragm in half section and in a perspective representation seen obliquely from below.

DETAILED DESCRIPTION

Figure 1:
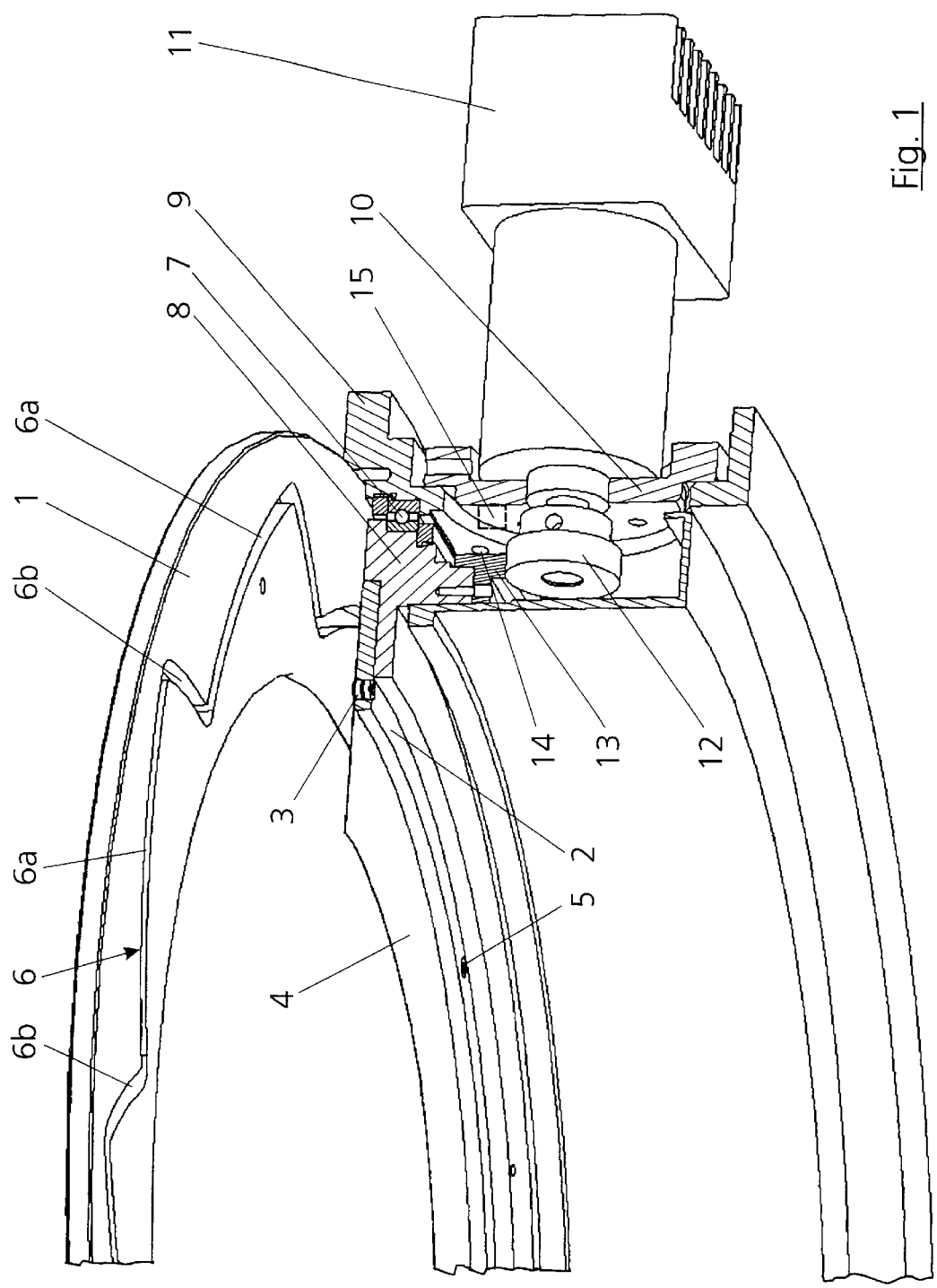
FIG. 1 shows an illustration of half a side (partially in section) of the iris diaphragm according to the invention with a drive device, in a perspective representation.

The iris diaphragm is fundamentally of known design, for which reason only the parts essential to the invention are considered in more detail below.

The iris diaphragm has a grooved ring 1 and a diaphragm base 2 arranged therebelow. Leaves 4 with one end in the grooved ring 1 are respectively guided via antifriction bearings 3 and mounted with the other end in the diaphragm base 2 via antifriction bearings 5.

The grooved ring 1 is provided with a circumferential track 6 which forms the curved tracks for adjusting the leaves 4 and which is split up into alternating useful-region curves 6a and return curves 6b in such a way as to produce a closed circumferential track (see FIG. 2). The antifriction bearings 3 run in the circumferential track 6, the leaves 4 thereby being guided in an appropriate circulating fashion. The return regions 6b are in each case designed at least approximately as multinomials.

For reason of stability and in order to improve guidance, two pairs of antifriction bearings 3 and 5 are provided in each case in the manner of a parallel guide for each leaf 4.

A large antifriction bearing 7 serves the purpose of guiding the grooved ring 1 with respect to the diaphragm base 2 as the said ring rotates. The antifriction bearing 7 is connected to a bearing flange 8 which is connected to the diaphragm base 2 and is therefore twisted with the diaphragm base 2.

The other side of the antifriction bearing 7 is fastened on a housing 9 of the iris diaphragm. A drive motor is fastened as rotary drive device 11 on a flange plate 10 of the housing 9. The drive motor 11 is provided with a driving pinion 12 which meshes with a toothed wheel 13. The toothed wheel 13 is connected to the bearing flange 8 and thereby drives the latter together with the diaphragm base 2. This means that the diaphragm base 2 rotates while the grooved ring 1, in which the leaves 4 are guided with their antifriction bearings 3 in the circumferential track 6, is fixed. Of course, however, the converse solution is also conceivable, in which case the grooved ring 1 rotates and the diaphragm base is fixed.

The rotary drive direction of the drive motor 11 is selected in this case such that upon opening of the diaphragm aperture, that is to say upon outward movement of the leaves 4, a tractive force is exerted on the leaves 4 in the return curves 6b.

The circumferential track 6 is partly designed as a continuous slot for reasons of assembly. This is the case respectively in the region of the useful-region curves 6a, while the return curves 6b are designed only as cutouts in the topside of the grooved ring 1. Consequently, the return curves 6b are indicated only by dashes in FIG. 3, since FIG. 3 illustrates the view obliquely from below.

Since a circulating movement instead of an oscillating movement of the diaphragm base 2 now takes place, a displacement measuring system should now be connected in order always to obtain exact positioning and corresponding control. For this purpose, it is possible, for example, to arrange on the toothed wheel 13 a switching cam 14 (not illustrated in more detail) which is scanned by a sensor, for example a contactless sensor 15 (dashed illustration in FIG. 1). Such displacement measuring systems and devices required for this purpose are generally known, and so will not be gone into in more detail below.

What is claimed is:

1. An iris diaphragm for an exposure lens, comprising a diaphragm base and a grooved ring which can be rotated relative to one another, a multiplicity of leaves defining a diaphragm aperture each mounted to the diaphragm base and to the grooved ring, the leaves being guided by curved tracks arranged in the grooved ring for the purpose of adjusting the diaphragm aperture, and having a drive device operable to rotate the grooved ring and diaphragm base relative to one another, wherein the curved tracks are formed as a circumferential track in the grooved ring, which track is split up into alternating useful-region curves and return curves, and wherein one of the diaphragm base and, grooved ring can be rotated in a preselected rotary drive direction by the drive device with the leaves being guided in the circumferential track.

2. The iris diaphragm as claimed in claim 1, wherein the return regions are at least approximately as multinomials.

3. The iris diaphragm as claimed in claim 1, wherein the leaves are each provided with bearings which are respectively guided in the circumferential track and mounted in the diaphragm base.

4. The iris diaphragm as claimed in claim 3, wherein the bearings are antifriction bearings.

5. The iris diaphragm as claimed in claim 4, wherein two of the antifriction bearings are provided for each leaf in the manner of a parallel guide.

6. The iris diaphragm as claimed in claim 1, wherein the rotary drive direction of the drive device and the courses of the useful-region curves and of the return curves are selected, such that upon opening of the diaphragm aperture in the track regions of the return curves a tractive force is exerted on the leaves.

7. The iris diaphragm as claimed in claim 1, wherein the useful-region curves and the return curves are designed as continuous slots in the grooved ring.

8. The iris diaphragm as claimed in claim 1 wherein the drive device is connected to the diaphragm base and is operable to rotate the diaphragm base relative to the grooved ring.

9. The iris diaphragm as claimed in claim 1 wherein each leaf includes one bearing connected to the diaphragm base and another bearing movably received within the circumferential track.

10. The iris diaphragm of claim 1 wherein the circumferential track is at least partially comprised of a circumferential groove formed in the grooved ring.

* * * * *